US010861574B2

(12) United States Patent
Niu et al.

(10) Patent No.: US 10,861,574 B2
(45) Date of Patent: *Dec. 8, 2020

(54) APPARATUS FOR MEMORY DEVICE TESTING AND FIELD APPLICATIONS

(71) Applicant: Taiwan Semiconductor Manufacturing Co., Ltd., Hsinchu (TW)

(72) Inventors: Baohua Niu, Hsinchu (TW); Ji-Feng Ying, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/551,901

(22) Filed: Aug. 27, 2019

(65) Prior Publication Data

US 2019/0385690 A1 Dec. 19, 2019

Related U.S. Application Data

(63) Continuation of application No. 15/993,709, filed on May 31, 2018, now Pat. No. 10,403,385.
(Continued)

(51) Int. Cl.
| G11C 29/12 | (2006.01) |
| G11C 11/16 | (2006.01) |
| G11C 13/00 | (2006.01) |
| G11C 29/44 | (2006.01) |
| G11C 29/50 | (2006.01) |
| G11C 29/08 | (2006.01) |

(Continued)

(52) U.S. Cl.
CPC ...... *G11C 29/12005* (2013.01); *G11C 11/161* (2013.01); *G11C 11/1673* (2013.01); *G11C 13/0002* (2013.01); *G11C 13/004* (2013.01); *G11C 29/021* (2013.01); *G11C 29/028* (2013.01); *G11C 29/08* (2013.01); *G11C 29/44* (2013.01); *G11C 29/50* (2013.01); *G11C 29/56* (2013.01); *G11C 11/1675* (2013.01); *G11C 13/0069* (2013.01); *G11C 2029/0403* (2013.01); *G11C 2029/5006* (2013.01)

(58) Field of Classification Search
None
See application file for complete search history.

(56) References Cited

U.S. PATENT DOCUMENTS 6,735,726 B2 * 5/2004 Muranaka ........... G06F 11/1008
365/200
8,416,612 B2 4/2013 Higo et al.
(Continued)

*Primary Examiner* — Tan T. Nguyen
(74) *Attorney, Agent, or Firm* — Sterne, Kessler, Goldstein & Fox P.L.L.C.

(57) ABSTRACT

A memory test system is disclosed that includes a memory integrated circuit (IC) and a memory functional tester. The memory IC includes a plurality of memory banks, where each memory bank includes a plurality of memory cells. The memory functional tester includes an adjustable voltage generator circuit, a read current measurement circuit, and a controller. The memory functional tester performs a write/read functional test on the memory bank over a number of write control voltages to determine a preferred write control voltage, where the preferred write control voltage is designated for use during subsequent write operations to the memory bank during an operational mode.

21 Claims, 10 Drawing Sheets

Related U.S. Application Data

(60) Provisional application No. 62/527,901, filed on Jun. 30, 2017.

(51) Int. Cl.
    *G11C 29/56*     (2006.01)
    *G11C 29/02*     (2006.01)
    *G11C 29/04*     (2006.01)

(56) References Cited

U.S. PATENT DOCUMENTS

| | | | |
|---|---|---|---|
| 10,403,385 B2 * | 9/2019 | Niu | G11C 29/50 |
| 2010/0328998 A1 * | 12/2010 | Higo | G11C 11/1675 365/171 |
| 2011/0096601 A1 * | 4/2011 | Gavens | G11C 11/5628 365/185.09 |
| 2013/0227200 A1 | 8/2013 | Cometti et al. | |
| 2013/0294144 A1 | 11/2013 | Wang et al. | |
| 2014/0226388 A1 | 8/2014 | Khoueir et al. | |
| 2015/0220388 A1 * | 8/2015 | Wu | G11C 13/0033 714/773 |
| 2016/0276009 A1 | 9/2016 | Lee et al. | |
| 2016/0284422 A9 | 9/2016 | Ong | |

\* cited by examiner

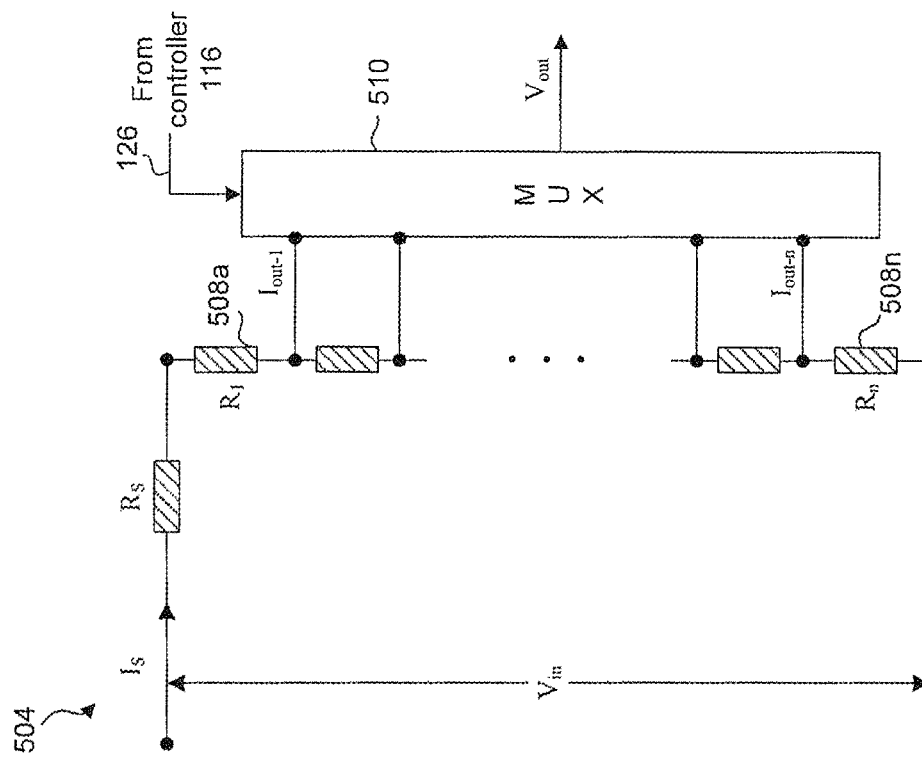
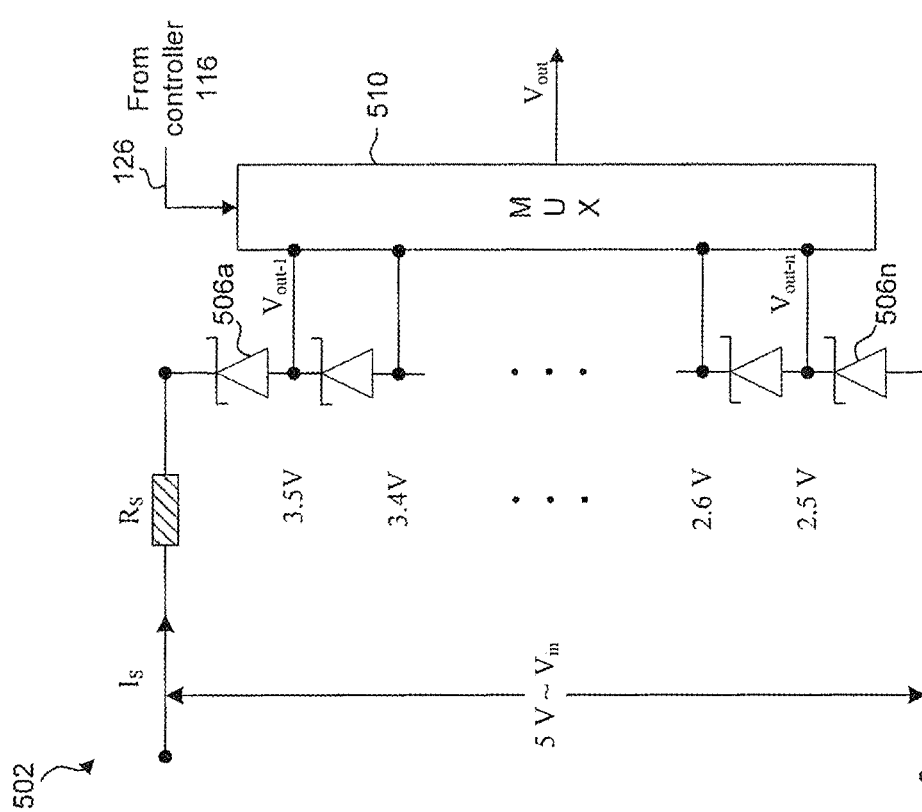
FIG. 5A
FIG. 5B

APPARATUS FOR MEMORY DEVICE TESTING AND FIELD APPLICATIONS

CROSS-REFERENCE TO RELATED APPLICATIONS

The present application is a continuation of U.S. patent application Ser. No. 15/993,709, filed May 31, 2018, which claims the benefit of U.S. Provisional Patent Appl. No. 62/527,901, filed Jun. 30, 2017, both of which are incorporated herein by reference in their entirety.

BACKGROUND

A data storage device is an electronic device for writing and/or reading electronic data. The data storage device can be implemented as volatile memory, such as random-access memory (RAM), which conventionally require power to maintain its stored information or non-volatile memory, such as read-only memory (ROM), which can maintain its stored information even when not powered. RAM can be implemented in a dynamic random-access memory (DRAM), a static random-access memory (SRAM), and/or a non-volatile random-access memory (MRAM), often referred to as a flash memory, configuration. The electronic data can be written into and/or read from an array of memory cells which can be accessible through various control lines.

Magnetic Random Access Memory (MRAM) and Resistive Random Access Memory (RRAM) are two types of recently developed memory devices. MRAM and RRAM are applicable for embedded memory, DRAM replacement, flash replacement, among other applications. MRAM and RRAM devices are inherently sensitive to process variations during device fabrication. Therefore, memory performance variations during testing are observed from die-to-die across a semiconductor wafer, and even block-to-block within a single integrated circuit (IC) die. Different die at different wafer locations (e.g. center die vs. edge die) and different blocks of a single large MRAM OR RRAM IC can often have very different read/write windows, and fail the performance test of read/write window margin at a very high rate, which can limit the usefulness of the MRAM and the RRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B illustrate circuit diagrams of an adjustable voltage generator circuit according to exemplary embodiments of the present disclosure.

DETAILED DESCRIPTION

Figure 1:
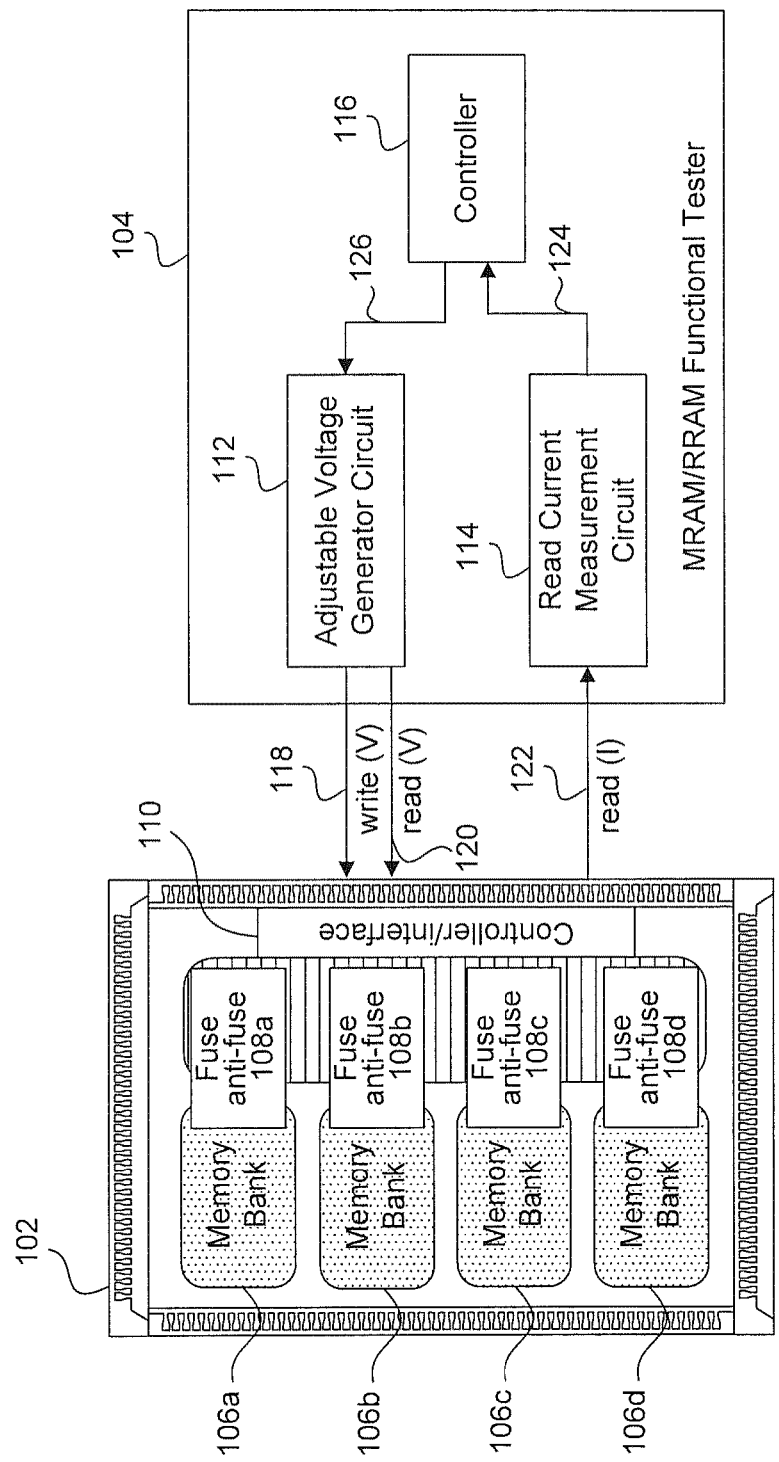
FIG. 1 illustrates a block diagram of a memory test system according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations discussed.

Overview

A memory test system is provided that includes a memory integrated circuit (IC) and a memory functional tester. The memory IC includes a number of memory banks, where each memory bank includes a number of memory cells. The memory functional tester performs a write/read functional test on the memory bank over a number of write control voltages to determine a preferred write control voltage. The memory functional tester includes an adjustable voltage generator circuit, a read current measurement circuit, and a controller. The adjustable voltage generator circuit generates the number of write control voltages to flip a logic state stored in the number of memory cells during corresponding write cycles of the write/read functional test. The adjustable voltage generator circuit further generates a number of read control voltages for the number of memory cells during corresponding read cycles of the write/read functional test. The read current measurement circuit measures a number of read currents generated by the number of memory cells that are received responsive to the number of read control voltages during the corresponding read cycles of the write/read functional test. The controller determines a number of error rates based on the number of read currents, where each error rate is associated with a corresponding write control voltage of the number of the write control voltages, and selects a preferred write control voltage from the number of write control voltages based on a comparison of the number of error rates with each other. The preferred write control voltage is designated for use during subsequent write operations to the memory bank during an operational mode.

Exemplary Memory Test System

FIG. 1 illustrates a memory test system 100 according to an exemplary embodiment of the present disclosure. Memory test system 100 includes memory integrated circuit (IC) 102 and a functional tester 104, where memory IC 102 can be a MRAM or RRAM memory device and functional tester 104 can and MRAM/RRAM functional tester.

Memory IC 102 is divided into memory banks 106a-d, where each memory bank 106a-d includes a number of individual memory cells. Memory IC 102 further includes a controller/interface 110 to provide an interface between memory IC 102 and the functional tester 104 and other external circuits. The memory banks 106a-d can be geographically dispersed across the memory IC 102, and therefore subject to disparate process variations from one memory bank 106a-d to another, which can affect memory performance if not addressed. Further, each memory bank 106a-d has an associated fuse/antifuse circuit 108 that implements a preferred write control voltage and/or read control voltage for the corresponding memory bank 106, where the preferred write control voltage and/or read control voltage is determined during functional testing as will be described below. Memory banks 106a-d are illustrated as four memory banks, but any number of memory banks can be used as will be understood by those skilled in the relevant art.

As will be described, functional tester 104 performs a write/read functional test on each memory bank 106a-d, in order to test the memory IC 102 over a range of write control voltages that are stepped and repeated. For a given write control voltage in the range of write control voltages, the functional test is performed by writing a first logic state (e.g., "1") into the memory cells of a memory bank 106a-d under test, and then subsequently reading back the logic states stored in memory cells of the memory bank 106a-d under test and recording the read current that is measured for each memory cell. Given the number of memory cells in the memory bank under test and their variation in semiconductor performance, this will result in a first distribution of read currents for the memory bank 106a-d under test that represent the first logic state. The process is repeated for the second logic stage (e.g. "0") for the given write control voltage, resulting in a second distribution of read currents for the memory bank 106a-d under test that represent the second logic state. An error rate is then determined for the memory bank under test for the particular write control voltage, where the error rate is determined based on the number of read currents that are found to be indeterminate, e.g., those read currents that cannot be classified as either logic "1" or a logic "0" because of their magnitude. The functional test is repeated for each write control voltage over the range of write control voltages, resulting in a corresponding n-number of error rates. A preferred write control voltage is then selected from the range write control voltages for operational use based on the error rates. For example, in an embodiment, the write control voltage having the lowest error rate can be selected as the preferred write control voltage. Afterwhich, read detection windows are determined based on the first and second read currents distributions associated with the preferred write control voltage.

Functional tester 104 includes an adjustable voltage generator circuit 112, a read current measurement circuit 114, and a controller 116, where the controller 116 controls the operation of the adjustable voltage generator circuit 112 and the current measurement circuit 114 via control signals, such as control signals 126 and 124, respectively. Controller 116 can include one or more processors operating according to instructions, such as computer instructions that are stored in an internal memory or an external memory, as will be understood by those skilled in the relevant art.

The functional test of each of the memory banks 106a-d includes a first write/read cycle followed a second write/read cycle to capture corresponding read current distributions for the two possible logic states (e.g., "0" and "1") that can be stored in the memory cell. During the first write cycle, the controller 116 directs the adjustable voltage generator circuit 112 to generate a (first) write control voltage 118 that is provided to the control interface 110 of the memory IC 102. The (first) write control voltage 118 is a one of n-number of write control voltages 118 that will be tested over a predetermined range. The controller interface 110 of the memory IC 102 applies the (first) write control voltage 118 to the memory cells of a particular memory bank 106a-d that is under test, such as memory bank 106a for purposes of discussion. Generally, a relatively high voltage (e.g. 2.5 volts) is required to "flip" the logic state of an MRAM memory cell or a RRAM memory cell (e.g. flip from a "0" to a "1", or vice versa). Whereas, a relatively low voltage will not "flip" the logic state of the MRAM memory cell or RRAM memory cell, and therefore the stored logic state remains the same for the relatively low voltage. Accordingly, assuming the initial logic state stored in the memory cells in memory bank 106a are a logic "0", the adjustable voltage generator circuit 112 generates a relatively high write control voltage 118 (e.g., 2.5 volts) to be applied to the memory cells in the memory bank 106a, in order to flip the logic states from a logic "0" to a logic "1".

During the first read cycle of the functional test, the controller 116 directs the adjustable voltage generator circuit 112 to generate a read control voltage 120 that is provided to the control interface 110 of the memory IC 102. The controller interface 110 of the memory IC 102 applies the read control voltage 120 to the memory cells of the memory bank 106a. The read control voltage 120 generally has a lower voltage magnitude than the write control voltage 118, so that the logic state stored in the memory cells of the memory bank 106a are not flipped (again) during the read cycle by the read control voltage 120. For example, the read control voltage 120 can be a fraction (e.g. 50%) of the write control voltage 118. The read control voltage 120 causes each memory cell of the memory bank 106a to generate a read current 122 that is forwarded to the functional tester 104 by the control interface 110 for evaluation. The read current measurement circuit 114 in the functional tester 104 measures the read current 122, which indicates a stored logic state of the particular memory cell of the memory bank 106a. Generally, a relatively low read current 122, indicates that a memory cell of the memory bank 106a is in a high resistance state, which represents a logic "0" being stored in the memory cell. Whereas, a relatively high read current 122, indicates that the memory cell of the memory bank 106a is in low resistance state, which represents a logic "1" being stored in the memory cell of the memory bank 106a. The read current measurement circuit 114 provides a current measurement 124 for each memory cell in the memory bank 106a to the controller 116. Given the number of memory cells in the memory bank 106a under test, this results in a first distribution of read currents that represent a logic "1", e.g. low resistance state assuming the memory bank 106a initially stored logic "0" and was flipped to a logic "1" by the (first) write control voltage 118.

The second write/read cycle is substantially a duplicate of the first write/read cycle of the functional test, so as to capture a second distribution read currents that represent a logic "0", e.g. the high resistance state assuming the memory bank 106a previously stored a logic "1." More specifically, after the first write/read cycle, the (first) write control voltage 118 is applied again to the memory cells of a memory bank 106a so as to "flip" the logic state of an MRAM memory cell or a RRAM memory cell (e.g. flip from a "1" to a "0") to measure the high resistance state. The read voltage 120 is again applied to the memory cells of the memory bank 106a, resulting in a second distribution of read currents 122 that represent a logic "0", e.g. high resistance state of the memory bank 106a. Accordingly, the controller 116 now has first and second read current distributions that represent the collective read currents 122 for the corresponding low resistance (e.g. logic "1") and high resistance (e.g. logic "0") logic states of the memory bank 106a under test when the (first) write control voltage 118 is used to "flip" the logic state stored in the memory cells.

The functional test described above is repeated for each write control voltage 118 in the range of write control voltages that are available for use, resulting in n-number high resistance and low resistance current distributions. For example, the write control voltage 118 can be stepped in predetermined voltage increments, (e.g., 0.1 v) over the range of available write control voltages, resulting in n-number of write control voltages 118 and the corresponding write/read functional tests being performed as described above.

Figure 2:
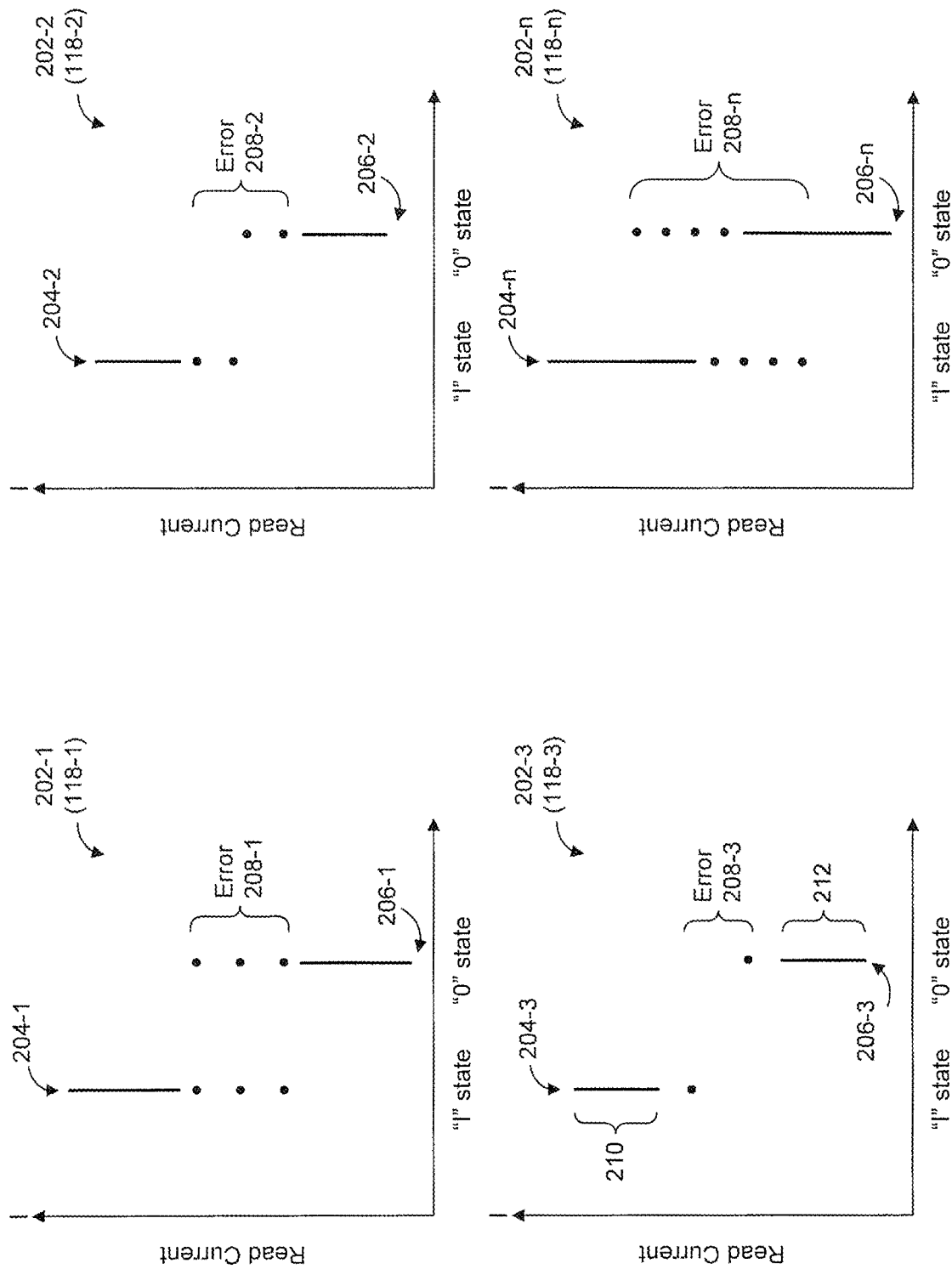
FIG. 2 illustrates a number of read current distributions that result from performing a write/read functional test over the range of available write control voltages according to an exemplary embodiment of the present disclosure.

FIG. 2 illustrates the current distributions 202-1 through 202-n that result from performing the write/read functional test over the range of available write control voltages 118-1 through 118-n for an example memory bank 106a. As can be seen, current distributions 202-1 through 202-n include respective low resistance current distributions 204-1 through 204-n and respective high resistance current distributions 206-1 through 206-n that correspond to their respective logic states "1" and "0". The low resistance current distributions 204-1 through 204-n are generally greater magnitude than their respective high resistance current distributions 206-1 through 206-n, for each respective write control voltage 118-1 through 218-n. Further, the respective current distributions 202-1 through 202-n have differing "spreads" in distribution currents for the differing write control voltages 118-1 through 218-n. For example, current distribution 202-1 (resulting from write control voltage 118-1) has a wider "spread" than that of current distribution 202-3, because the individual currents are bunched tighter together for current distribution 202-3. As indicated above, the relative performance of the memory bank 106a under test will vary over process corners, die location, and also write control voltages 118 as illustrated by FIG. 2. As will be understood by those skilled in the art, it is generally more favorable to have a narrow "spread" for the current distributions 204-1 through 204-n and 206-1 through 206-n, as this generally leads to greater separation between the low resistance current distributions 204-1 through 204-n and their respective high resistance current distribution 206-1 through 206-n, so that read currents 122 can be easily assigned to a logic state during the operational mode.

Further, current distributions 202-1 through 202-n include a number of respective error currents, collectively represented as error currents 208-1 through 208-n in respective current distributions 202-1 through 202-n. Each of these error currents 208-1 through 208-n has a magnitude that falls in between the respective low resistance current distributions 204-1 through 204-n and the respective high resistance current distributions 206-1 through 206-n, as shown in FIG. 2. Accordingly, the respective logic states represented by error currents 208-1 through 208-n are indeterminate, and therefore define the error rate for the memory bank 106a at the corresponding write control voltage 118. The various error currents 208-1 through 208-n for the corresponding write control voltages 118-1 through 218-n can be analyzed and compared to select the write control voltage that produces the lowest error rate for the memory bank 106a under test. For example, in FIG. 2, the current distribution 202-3 generated using the write control voltage 118-3 produces the least number of error currents 208-3 during the functional test of the memory bank 106a. Accordingly, the write control voltage 202-3 can be selected as the preferred write control voltage 118 that is to be used for the memory bank 106a when subsequently used for data storage during an operational mode, because the write control voltage 202-3 provides the lowest error rate of the range of available write control voltages 118. Likewise, the preferred read control voltage 120 can be determined as a fraction (e.g. 50%) of the preferred write control voltage 118.

The error rate associated with each of the write control voltages 118-1 through 218-n is determined as the number of error currents determined for the particular write control voltage 118 divided by the total number of memory cells in the memory bank 106a, which is also the same as the number of read currents 122 generated during a given read cycle of the functional test. The controller 116 can then determine if the error rate exceeds a predetermined threshold, and if so then the memory bank 106a is marked "fail" and is not used for field applications during the operational mode. Otherwise, it is marked a "pass" so that it can be used to store data during the operational mode.

Once the preferred write control voltage 118 is selected and memory bank 106a is determined to have passed the error rate test, the controller 116 can determine first and second read detection windows that can be used to determine first and second logic states for the preferred write control voltage 118 during the operational mode. Referring to FIG. 2, read detection window 210 is determined for the logic state "1" and the read detection window 212 is determined for the logic state "0" given the current distributions 202-3 provided by the preferred write control voltage 118-3. Specifically, the read detection window 210 is determined to fit the low resistance current distribution 204-3, and the read detection window 212 is determined to fit the high resistance current distribution 206-3 determined during the functional test. Accordingly, during operational use of the memory bank 106a, future read currents 122 will be compared against the read detection windows 210 and 212 to determine whether they represent a logic state "1" or a logic state "0" being stored in the corresponding memory cells of the memory bank 106a. As a result of this procedure, it is noted that the first and second read detection windows 210 and 212 are selected for the memory bank 106a based on the current distributions provided by the preferred write control voltage 118 that was determined for the memory bank 106a.

The functional test procedure described above is repeated for each memory bank of the number of memory banks 106a-d. As a result, a preferred write control voltage 118 and a preferred read voltage 120 are determined for each of the memory banks 106a-d, assuming that the functional test is passed for the corresponding memory bank 106. After which, the preferred write control voltage 118 and preferred read control voltage 120 are permanently "locked-in" by the corresponding fuse/anti-fuse circuit 108 for each memory bank 106, so that the preferred write control voltage 118 and read control voltage 120 are subsequently used for field applications of the corresponding memory bank 106. Likewise, the first and second read detection windows 210 and 212 can also be stored in a memory for subsequent use during future read operations for read current evaluation. Herein, a fuse/anti-fuse circuit 108 can include a fuse circuit and/or an anti-fuse circuit to perform the described functionality, as will be understood by those skilled in the art.

Figure 3A:
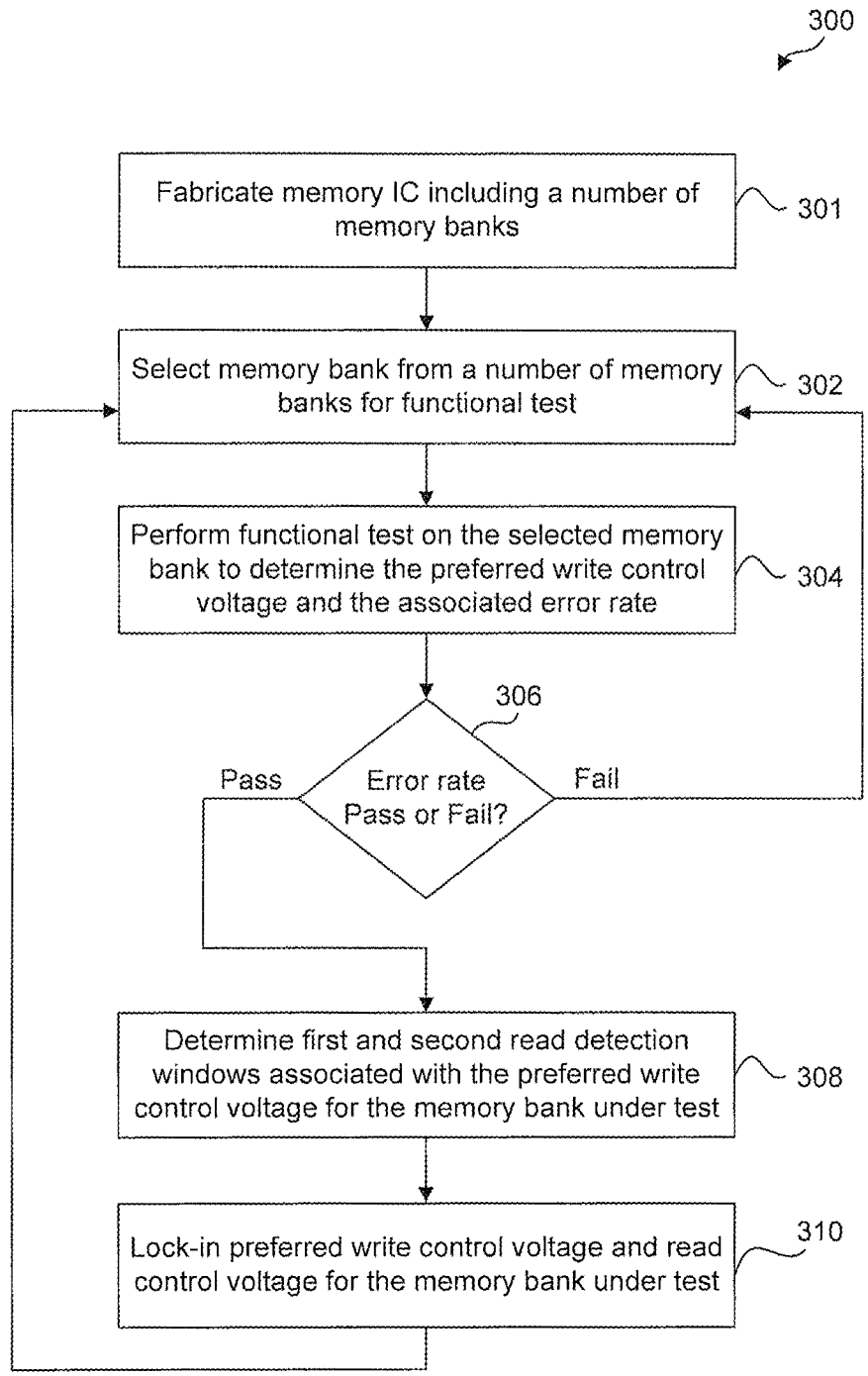
FIG. 3A illustrates a flowchart of an exemplary operation for performing a functional test of a memory device, according to an exemplary embodiment of the present disclosure.

FIG. 3A illustrates a flowchart 300 of an exemplary operation for performing manufacturing including a functional test of a memory device, such as an MRAM or RRAM device, according to an exemplary embodiment of the present disclosure. The flowchart 300 makes reference to the memory test system 100 in FIG. 1 and the read current distributions 202 in FIG. 2 for example purposes only. The disclosure is not limited to this operational description or its application to memory test system 100. Rather, it will be apparent to ordinary persons skilled in the relevant art(s) that other operational control flows, systems, and applications are within the scope and spirit of the present disclosure.

At step 301, a memory device, such as memory IC 102 having memory banks 106a-d, is fabricated (e.g. manufactured) using techniques that are known to one skilled in the art. The known semiconductor fabrication techniques can include one or more of: deposition, planarization, lithography, diffusion or ion implantation, and/or other semiconductor wafer processing techniques that are known to one skilled in the art.

At step 302, a memory bank is selected from a number of memory banks 106a-d for a write/read functional test. For example, memory bank 106a can be selected for the functional test for discussion purposes.

At step 304, the functional test is performed on the selected memory bank 106. For example, the functional tester 104 can perform the write/read functional test, as described above, applying a range of write control voltages 118 and corresponding read control voltages 120 to the memory bank 106a. The outcome of the functional test provides the preferred write control voltage 118 that the memory bank 106a can use during the operational mode and the corresponding error rate associated with the preferred write control voltage 118.

At step 306, it is determined whether the memory bank 106a-d under test passed the functional test based on the error rate associated with the preferred write control voltage 118. For example, the controller 116 can determine whether the memory bank 106a passes the functional test by determining whether the error rate associated with preferred write control voltage 118 exceeds a predetermined threshold. If error rate exceeds the predetermined threshold, then the memory bank 106a fails the functional test, and then control flows to step 302 to select another memory bank 106a-d for test. If the error rate is below the predetermined threshold, then the memory bank 106a passes the functional test, and control flows to step 308.

At step 308, once the memory bank 106a-d under test is determined to have passed the error rate test, the first and second read detection windows can be determined for the memory bank 106a-d under test. For example, the controller 116 can determine first and second read detection windows associated the preferred write control voltage 118, and that can be used to determine first and second logic states during the operational mode of the memory bank 106a under test.

Referring to FIG. 2, read detection window 210 is determined for the logic state "1" and the read detection window 212 is determined for the logic state "0" given the current distributions 202-3 associated with the preferred write control voltage 118-3. Specifically, the read detection window 210 is determined to fit the low resistance current distribution 204-3, and the read detection window 212 is determined to fit the high resistance current distribution 206-3 determined during the functional test. Accordingly, during operational use of the memory bank 106a, future read currents 122 will be compared against the read detection windows 210 and 212 to determine whether the read currents represent a logic state "1" or a logic state "0" being stored in the corresponding memory cells. If a future read current 122 falls outside both the read detection window 210 and the read detection window 212, then the associated logic state is indeterminate.

At step 310, the preferred write control voltage 118 and the preferred read control voltage 120 for the memory bank 106a-d under test are "locked-in" for future use by the memory bank 106a-d under test. For example, the fuse/anti-fuse circuit 108 for the memory bank 106a can be manipulated so that the preferred write control voltage 118 and the preferred read control voltage 120 are used by the memory bank 106a for future write/read applications, including field use application during the operational mode. Likewise, the first and second read detection windows 210 and 212 can also be stored in a memory for subsequent use during future read operations for read current evaluation.

Figure 3B:
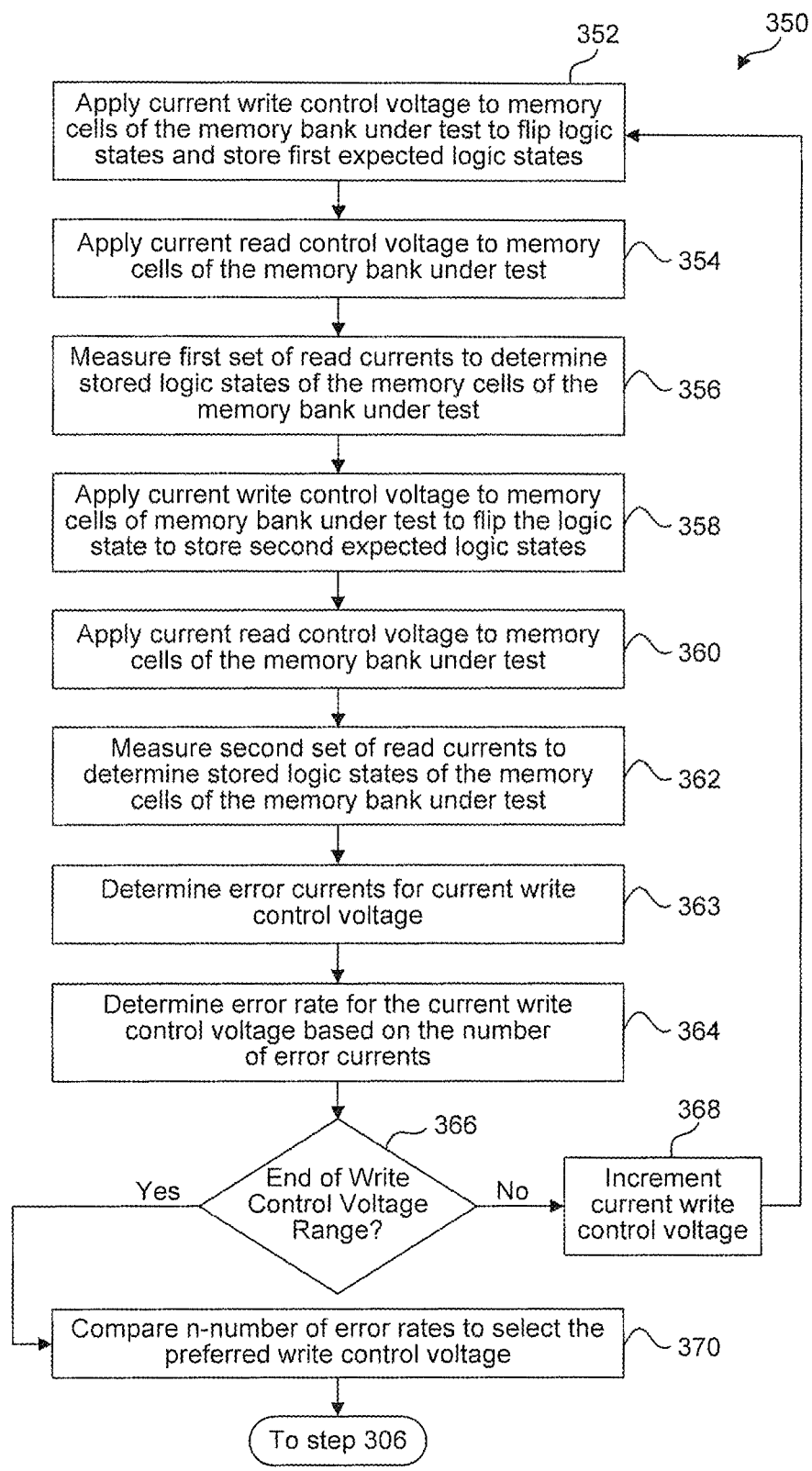
FIG. 3B illustrates a flowchart of a second exemplary operation for performing a functional test of a memory device according to an exemplary embodiment of the present disclosure.

FIG. 3B illustrates a flowchart 350 of an exemplary operation for performing a functional test of a memory bank, such as an MRAM or RRAM memory bank, according to an exemplary embodiment of the present disclosure. More specifically, flowchart 350 further describes step 304 in flowchart 300 of FIG. 3A, as applied to an exemplary memory bank 106a-d under test, such as memory bank 106a.

At step 352, during the first write cycle, a current write control voltage 118 is applied to individual memory cells of the memory bank 106a to "flip" the logic state stored in the individual memory cells of the memory bank 106a. For example, the adjustable voltage generator circuit 112 can generate a write control voltage 118 that is provided to the control interface 110 of the memory IC 102. The controller interface 110 of the memory IC 102 applies the write control voltage 118 to the memory cells of the memory bank 106a. Assuming that the initial logic state was "0", then the individual memory cells can receive the same write control voltage 118 to flip the logic states from "0" to an expected logic state of "1".

At step 354, during the first read cycle of the functional test, a current read control voltage 120 is applied to individual memory cells of the memory bank 106a to enable reading the actual logic states stored in the memory cells of the memory bank 106a. For example, the adjustable voltage generator circuit 112 can generate a read control voltage 120 that is provided to the control interface 110 of the memory IC 102. In an embodiment, the current read control voltage is set to a fraction (e.g. 50%) of the current write control voltage 118. The controller interface 110 of the memory IC 102 applies the read control voltage 120 to the memory cells of the memory bank 106a. The read control voltage 120 causes the memory cells of the memory bank 106a to each generate a first read current 122 that is forwarded to the functional tester 104 by the control interface 110 for evaluation.

In step 356, the read current is measured for each memory cell of the memory bank 106a. For example, the read current measurement circuit 114 in the functional tester 104 measures the read current 122 to generate a read current measurement 124 for each memory cell in the memory bank 106a. Generally, a relatively low read current 122, indicates that a memory cell of the memory bank 106a is in a high resistance state, which represents a logic "0" being stored in the memory cell. Whereas, a relatively high read current 122, indicates that the memory cell of the memory bank 106a is in low resistance state, which represents a logic "1" being stored in the memory cell of the memory bank 106a. The read current measurement circuit 114 provides a current measurement 124 for each memory cell in the memory bank 106a to the controller 116, resulting in a first set of read current measurements 124 that are received for evaluation. Given the number of memory cells in the memory bank 106a-d under test, this results in a first distribution of read currents that represent a logic "1", e.g. low resistance state assuming the memory bank 106a initially stored logic "0" and was flipped to a logic "1" by the current write control voltage 118.

At step 358, during the second write cycle, the current write control voltage 118 is re-applied to individual memory cells of the memory bank 106a to "flip" the logic state stored in the individual memory cells for the memory bank 106a. For example, the adjustable voltage generator circuit 112 can generate a write control voltage 118 that is provided to the control interface 110 of the memory IC 102. The controller interface 110 of the memory IC 102 applies the write control voltage 118 to the memory cells of the memory bank 106a. Assuming that the previous logic state was "1", the individual memory cells can receive the same write control voltage 118 to "flip" the logic states from "1" to an expected logic state of "0".

At step 360, during the second read cycle of the functional test, a current read control voltage 120 is applied to individual memory cells of the memory bank 106a to enable reading the actual logic states stored in the memory cells of the memory bank 106a. For example, the adjustable voltage generator circuit 112 can generate a read control voltage 120 that is provided to the control interface 110 of the memory IC 102. In an embodiment, the current read control voltage is a fraction (e.g. 50%) of the current write control voltage 118. The controller interface 110 of the memory IC 102 applies the read control voltage 120 to the memory cells of the memory bank 106a. The read control voltage 120 causes the memory cells of the memory bank 106a to each generate a second read current 122 that is forwarded to the functional tester 104 by the control interface 110 for evaluation.

In step 362, the read current is measured for each memory cell of the memory bank 106a for a second time. For example, the read current measurement circuit 114 in the functional tester 104 measures the read current 122 to generate a second read current measurement 124 for each memory cell in the memory bank 106a. Generally, a relatively low read current 122, indicates that a memory cell of the memory bank 106a is in a high resistance state, which represents a logic "0" being stored in the memory cell. Whereas, a relatively high read current 122, indicates that the memory cell of the memory bank 106a is in low resistance state, which represents a logic "1" being stored in the memory cell of the memory bank 106a. The read current measurement circuit 114 provides a second read current measurement 124 for each memory cell in the memory bank 106a to the controller 116, resulting in a second set of read current measurements 124 that are received for evaluation. Given the number of memory cells in the memory bank 106a-d under test, this results in a second distribution of read currents that represent a logic "0", e.g. high resistance state assuming the memory bank 106a previously stored a logic "1" and was flipped to a logic "0" by the current write control voltage 118.

After step 362, both the high resistance current distribution and the low resistance current distribution for the memory bank 106a have been measured for the current write control voltage 118, as respectively illustrated by current distributions 204-1 and 206-1 shown in FIG. 2. Further, the number of error currents 208-1 are also apparent. Accordingly, at step 363, the error currents are determined for the current write control voltage 118. For example, the controller 116 can examine the current distribution 202-1 and determine the error currents 208-1, wherein each error current 208-1 has a magnitude that falls in between the recognized low resistance current distribution 204-1 and the high resistance current distribution 206-1. Accordingly, the logic states represented by error currents 208-1 are indeterminate, and therefore determine the overall error rate for the memory bank 106a when using the current write control voltage 118.

At step 364, the error rate that is associated with the current write control voltage 118 is determined. For example, the controller 116 can determine the error rate as: the (number of error currents 208) divided by (the total number of memory cells in the memory bank 106a), which is the same as the number of read currents 122 generated during a given functional test at a particular write control voltage 118.

At step 366, it is determined whether the current write control voltage is at the end of the range of available write control voltages. As described above, the write control voltage 118 is to be stepped in predetermined voltage increments, (e.g., 0.1 v) over the range of available write control voltages, resulting in n-number of write control voltages 118 and corresponding write/read functional tests. Accordingly, the controller 116 can determine at step 366 if the current write control voltage 118 is last write control voltage in the range of available write control voltages 118. If yes, then control flows to 370. If not, then control flows to step 368.

At step 368, the current write control voltage 118 is incremented by a predetermined amount. For example, the controller 116 can instruct the adjustable voltage generator circuit 112 to increment the write control voltage 118 by a predetermined voltage amount, (e.g., 0.1 v). After step 368, control flows back to step 352 so the write/read functional test can be re-run using the incremented write control voltage 118.

At step 370, the n-number of error rates corresponding to the n-number of write control voltages 118 are compared, and a preferred write control voltage 118 is selected based on the comparison. For example, the controller 116 can compare the error rates measured during the functional write/read test and select the write control voltage 118 that provides the lowest error rate from the n-number of error rates determined. For example, referring to FIG. 2, the current distributions 202-3 illustrate the least number of error currents 208, and therefore have the lowest error rate. Accordingly, the controller 116 can select the corresponding write control voltage 118-3 of the range of write control voltages since the write control voltage 118-3 produced the lowest error rate. Further, the preferred read control voltage 120 can be selected as a fraction (e.g. 50%) of the preferred write control voltage 118. After step 370, control flows back to step 306 in flowchart 300 of FIG. 3A.

Figure 4:
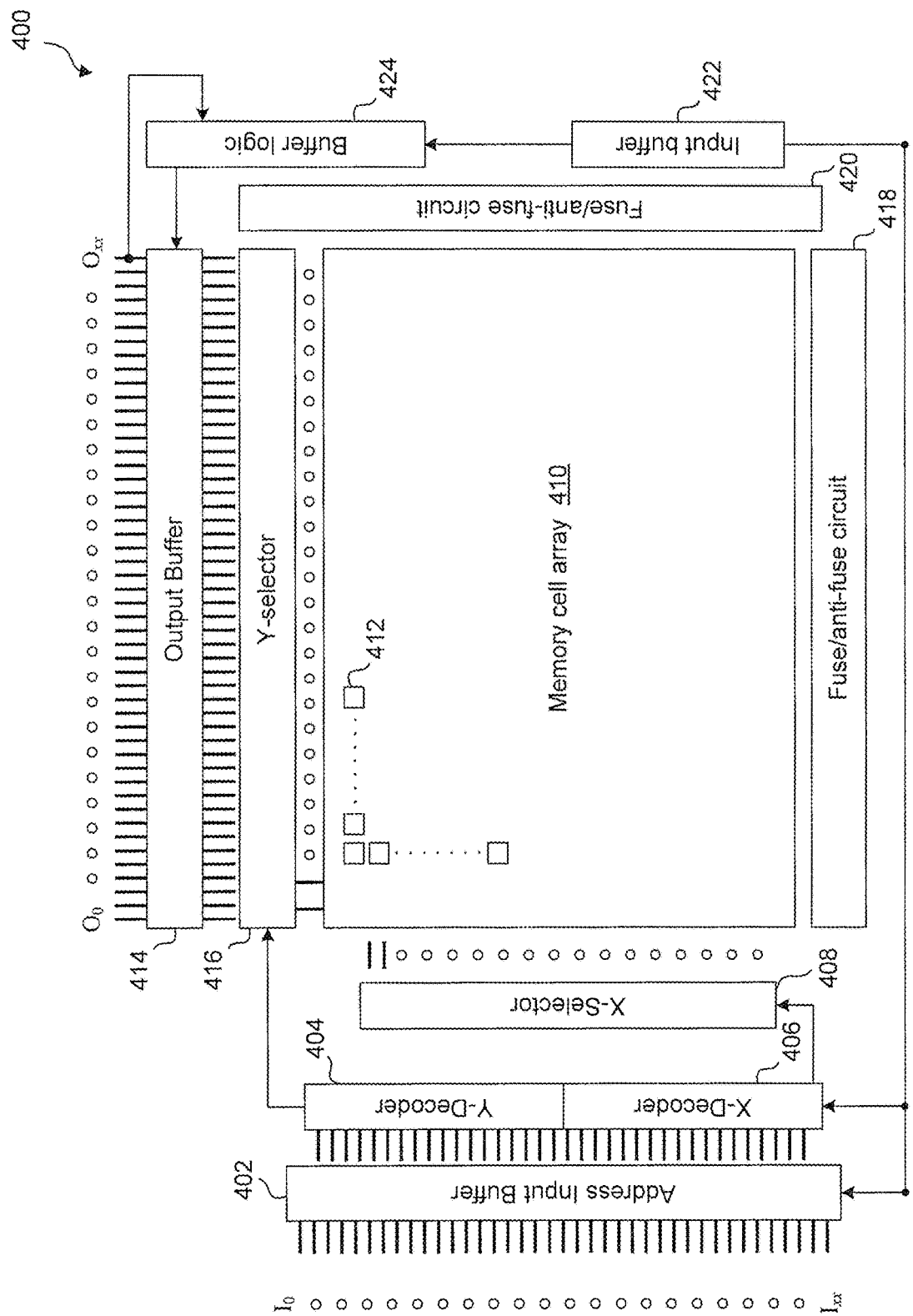
FIG. 4 illustrates a block diagram of memory device accordingly to a second exemplary embodiment of the disclosure.

FIG. 4 further describes a memory bank 400 accordingly to an exemplary embodiment of the disclosure. For example, the memory bank 400 can be a MRAM or RRAM memory bank, and representative of one of memory banks 106a-d that shown in FIG. 1.

Memory bank 400 includes a memory cell array 410 that includes a number memory cells 412, arranged in rows and columns as shown. The memory bank 400 further includes address input buffer 402, an x-decoder 406, a y-decoder 404, an x-selector 408, an output buffer 414, a y-selector 416, a fuse/anti-fuse circuit 418, a fuse/anti-fuse circuit 420, an input buffer 422, and buffer logic 424.

During operation, the address input buffer 402 receives an address that identifies a memory cell 412 of the memory array 410 that is to be accessed for a read or write operation. The x-decoder 406 and y-decoder 404 decode the address to respectively determine the row and column of the identified memory cell 412. The x-selector circuit 408 enables the row of the identified memory cell 412 based on the output of the x-decoder 406, and the y-selector circuit 416 enables the column of the identified memory cell 412 based on the output of the y-decoder 404, so that the identified memory cell 412 can be accessed for read or write. The input buffer 422 receives any data to be written to the identified memory cell 412, and the output buffer 414 temporarily stores any data read from the identified memory cell 412. The buffer logic circuit 424 controls the timing of the read and write operations by controlling the input buffer 422 and the output buffer 414. The fuse/anti-fuse circuit 418 applies the preferred write control voltage 118 and/or read control voltage 120 that was determined for the memory bank 400 during the functional test as described in steps 208-210 of flowchart 200 for the prospective read/write operation. As described above, it is contemplated that each memory bank 106,400 will have a preferred write control voltage 118 and read control voltage 120. Additionally, the present disclosure can be extended so that individual memory cells 412 or a group of memory cells within the memory bank 400 can have an individual preferred write control voltage and an individual read control voltage as provided by the fuse/anti-fuse 420.

FIGS. 5A and 5B illustrate adjustable voltage generator circuits 502 and 504 that are representative of adjustable voltage generator circuit 112 according to embodiments of the present disclosure.

In FIG. 5A, adjustable voltage generator circuit 502 includes a number of zener diodes 506a-n that are series-connected, a resistor Rs, and a multiplexer 510. The adjustable voltage generator circuit 502 receives an input voltage Vin and generates a number of voltages Vout-1 through Vout-n, which are stepped incrementally based on the voltage drop caused by each zener diode 506. The multiplexer 510 receives the voltages Vout-1 through Vout-n and selects one as the output Vout, based on a control signal from the controller 116. The selected output voltage Vout can be the write control voltage 118 or the read control voltage 120 for application to the memory bank 106a-d under test, as described above in flowcharts 200 and 300. Accordingly, using this technique, the write control voltage 118 and read control voltage 120 can be repeatedly and incrementally stepped during the functional test of the corresponding memory bank 106a-d as described above in flowcharts 300 and 350. FIG. 5A illustrates a voltage range from 2.5-3.5 volts, with 0.1 volt increments, but other ranges and/or incremental steps could be used as will be understood by those skilled in the arts based on the discussion herein.

In FIG. 5B, adjustable voltage generator circuit 504 includes a number of resistors 508a-n that are series-connected, a resistor Rs, and the multiplexer 510. The adjustable voltage generator circuit 504 receives an input voltage Vin and provides a number of output currents Iout-1 through Iout-n, which are stepped incrementally based on the incremental resistance provided by each resistor 508. The multiplexer 510 receives the output currents Iout-1 through Iout-n and selects one as the output Iout, based on a control signal 126 from the controller 116. The selected output current Iout, when driven through a known impedance, can provide the write control voltage 118 or the read control voltage 120 for application to the memory bank 106a-d under test, as described above in flowcharts 300 and 340.

Figure 6A:
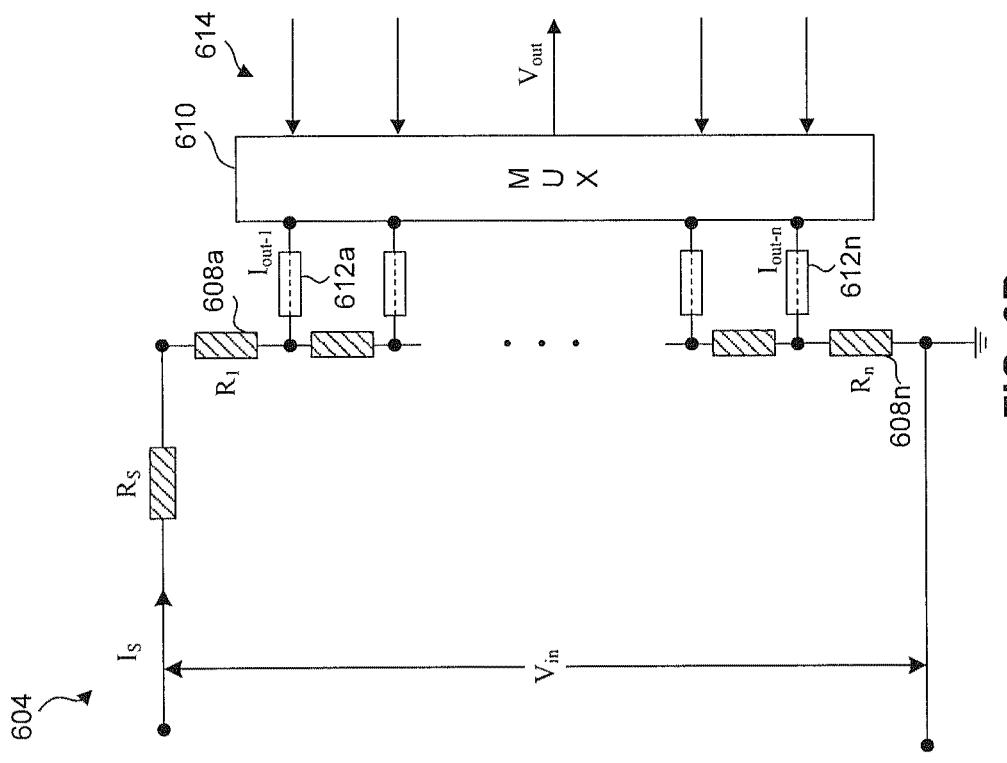
FIGS. 6A and 6B illustrate circuit diagrams of anti-fuse circuits that can be used in a memory device according to exemplary embodiments of the present disclosure.
Figure 6B:
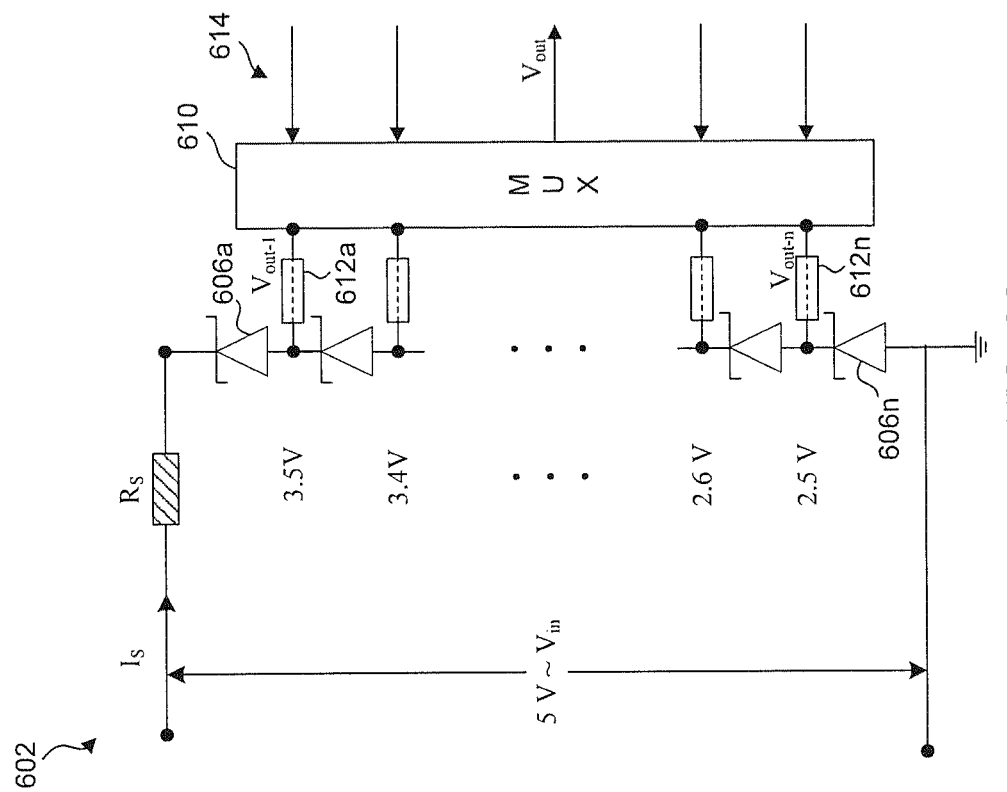

FIGS. 6A and 6B illustrate anti-fuse circuits 602 and 604 that are representative of fuse/anti-fuse circuits 108 according to embodiments of the present disclosure.

In FIG. 6A, anti-fuse circuit 602 includes a number of zener diodes 606a-n that are series-connected, a resistor Rs, and a multiplexer 610, similar in configuration to the adjustable voltage generator circuit 502. The anti-fuse circuit 602 further includes a number of anti-fuses 612a-n that are each series connected to a corresponding zener diode 606. Each anti-fuse 612 can provide a low impedance electrical connection across its terminals upon being activated (or "blown") as will be understood by those skilled in the relevant art. For example, each anti-fuse 612 can be implemented with a capacitor structure having an oxide disposed between two metal plates, where the oxide is "blown" upon application of a high voltage 614 to electrically short the metal plates and thereby activate the anti-fuse 612. The high voltage 614 can applied via the multiplexer 610.

During operation, the anti-fuse circuit 602 receives an input voltage Vin and provides a number of output voltages Vout-1 through Vout-n, which are stepped incrementally based on the voltage drop caused by each zener diode 606. One anti-fuse 612 is selected to be blown, based on the preferred write control voltage 118 or preferred read voltage 120 that is determined during the functional testing described above for flowcharts 200 and 300. The multiplexer 610 combines all outputs of the anti-fuses 612, but only one anti-fuse 612 is activated so as to pass a corresponding control voltage as described above. Therefore, only one of Vout-1 through Vout-n corresponding to the activated anti-fuse 612 appears at Vout, which is applied to the corresponding memory bank 106a-d to provide the preferred write control voltage 118 or the preferred read control voltage 120 to the corresponding memory bank 106a-d during field application use.

In FIG. 6B, anti-fuse circuit 604 includes a number of resistors 608a-n that are series-connected, a resistor Rs, and a multiplexer 610, similar in configuration to the adjustable voltage generator circuit 504. The anti-fuse circuit 604 further includes a number of anti-fuses 612a-n that are each series connected to a corresponding resistor 608a-n. As discussed above, each anti-fuse 612 can provide a low impedance electrical connection across its terminals upon being activated (or "blown") as will be understood by those skilled in the relevant art. Each anti-fuse 612 can be implemented with a capacitor structure having an oxide disposed between two metal plates, where the oxide is "blown" upon application of a high voltage 614 to electrically short the metal plates and thereby activate the anti-fuse 612. The high voltage 614 can applied via the multiplexer 610.

During operation, the anti-fuse circuit 604 receives an input voltage Vin and provides a number of output currents Iout-1 through Iout-n, which are stepped incrementally based on the incremental resistance provided by resistors 608a-n. One anti-fuse 612 is selected to be blown, based on the preferred write control voltage 118 or preferred read voltage 120 that is determined during the functional testing described above for flowcharts 200 and 300. The multiplexer 610 combines all outputs of the anti-fuses 612, but only one anti-fuse 612 is activated so as to pass a current as described above. Therefore, only one of Iout-1 through Iout-n corresponding to the activated anti-fuse 612 appears as Tout, and is applied to the corresponding memory bank 106. Specifically, the selected output current Tout, when driven through a known impedance, can provide the preferred write control voltage 118 or the preferred read control voltage 120 for application to the memory bank 106a-d during field application use.

Figure 7:
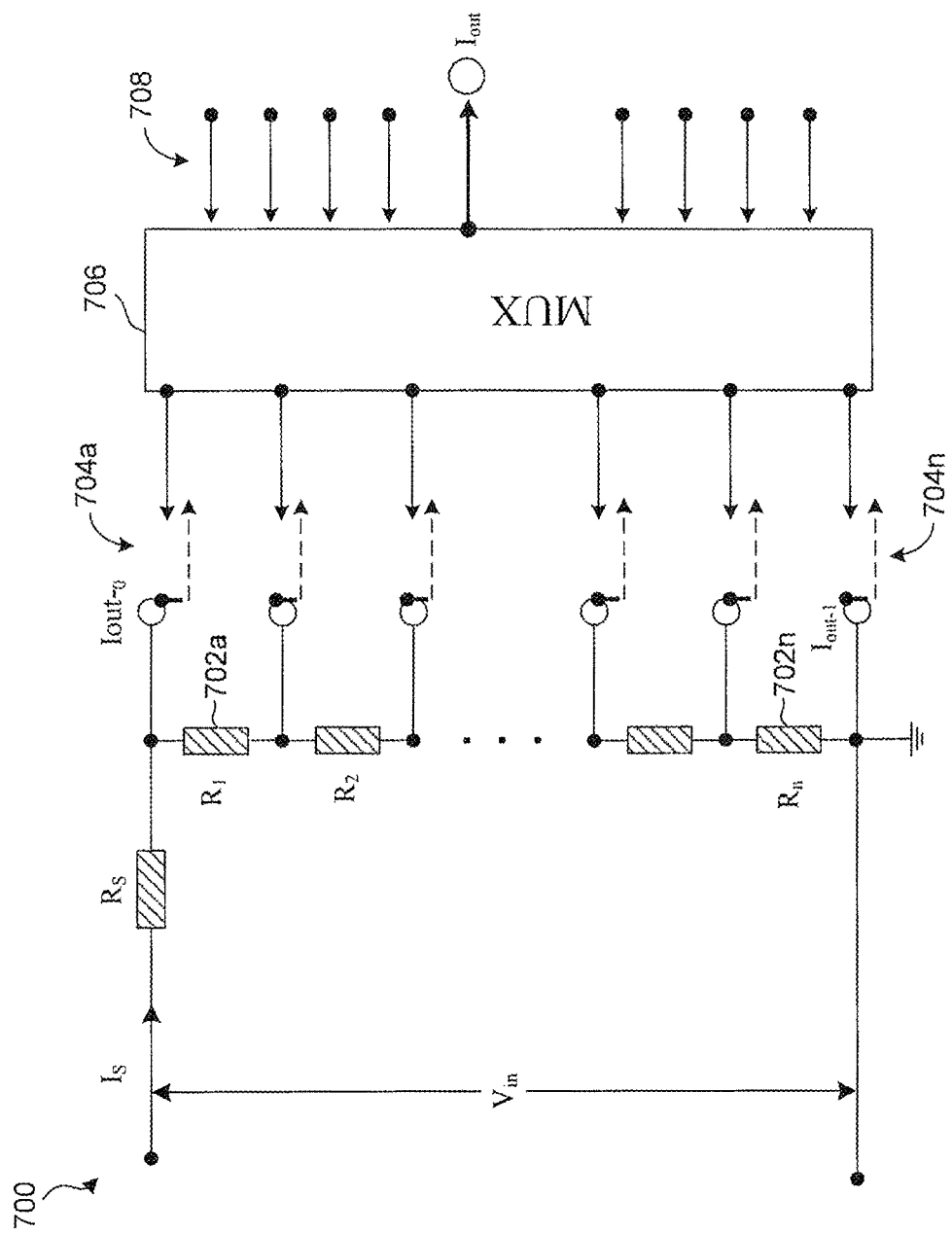
FIG. 7 illustrates a circuit diagram of a fuse circuit that can be used in a memory device in exemplary embodiments of the present disclosure.

FIG. 7 illustrates fuse circuit 700 that is representative of fuse/anti-fuse circuits 108 according to embodiments of the present disclosure. Fuse circuit 700 includes a number of resistors 702a-n that are series-connected, a number of fuses 704a-n, a resistor Rs, and a multiplexer 706. Each fuse 704 provides a low impedance electrical connection across its terminals in its nominal conducting state, but is designed to be "blown" (i.e. open-circuited) upon receiving a high threshold current, as will be understood by those skilled in the relevant art. Each fuse 704 can be implemented with a thin conductor that disintegrates upon receipt of a high current above the current threshold.

All the fuses 704a-n with the exception of one are blown, based on the preferred write control voltage 118 or preferred read control voltage 120 that is determined during the functional testing described above for flowcharts 200 and 300. The multiplexer 706 combines all outputs of the fuses 704a-n, but only one fuse 704 remains in a conducting state so as to pass a current. The fuses 704 can be blown by using high currents 706 that are above the fuse threshold limit that are applied via the multiplexer 706. Therefore, only one of Iout-1 through Iout-n, corresponding to the surviving selected fuse 704 appears at Tout, and is applied to the corresponding memory bank 106a-d for application field use. Specifically, the selected output current Tout, when driven through a known impedance, can provide the preferred write control voltage 118 or the preferred read control voltage 120 for application to the memory bank 106.

Figure 8:
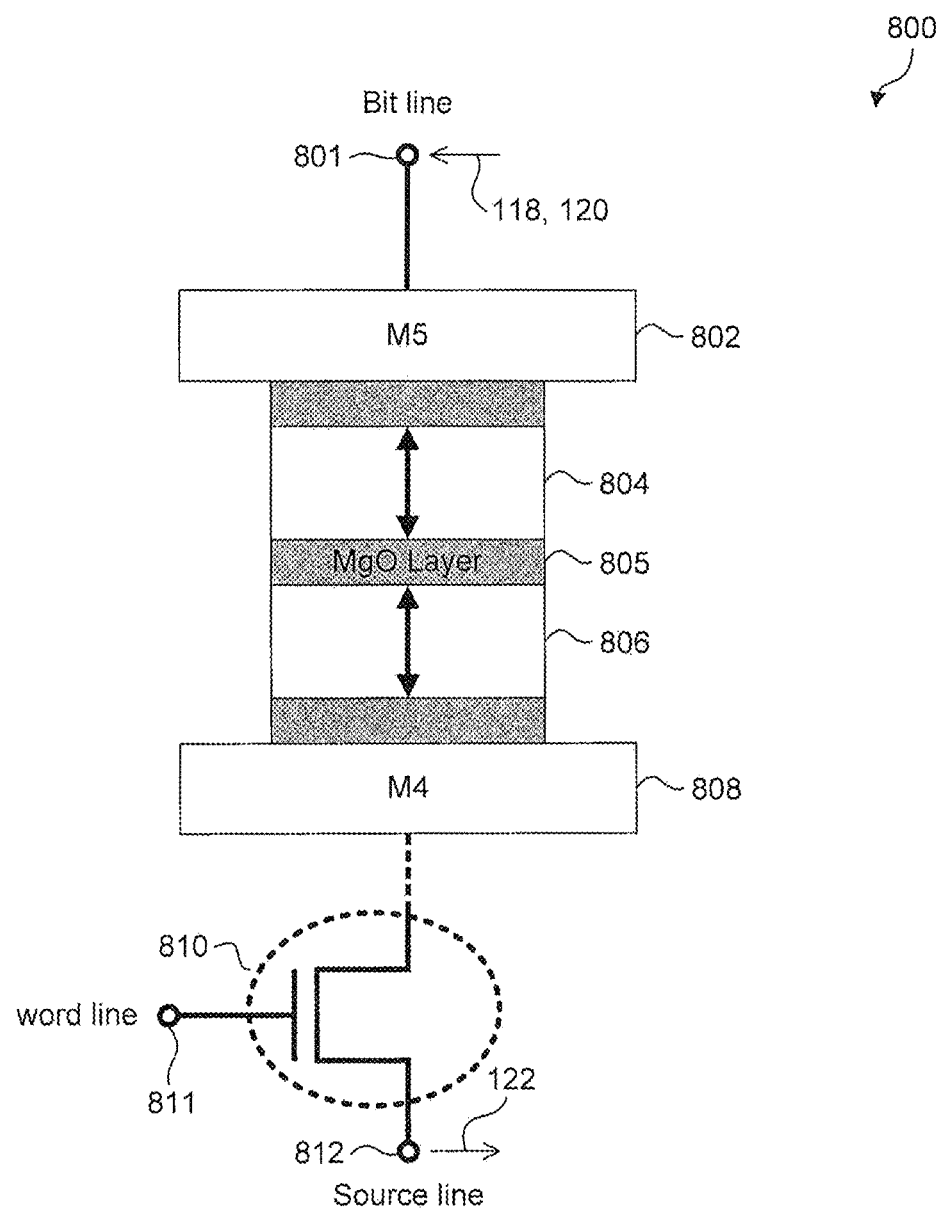
FIG. 8 illustrates an MRAM cell according to embodiments of the present disclosure.

FIG. 8 illustrates an MRAM cell 800 according to embodiments of the present disclosure. For example, MRAM cell 800 can be representative of one of the number of memory cells in the memory banks 106a-d discussed herein, and/or memory cell 412 of memory cell array 410. MRAM cell 800 is formed of a number of semiconductor layers in a stacked configuration, including metal layers 802 and 808, an adjustable magnet layer 804, a permanent magnet layer 806, and a magnesium oxide layer 805 that separates the adjustable magnet layer 804 from the a permanent magnet layer 806. The MRAM cell 800 further includes a bit line terminal 801, a source line terminal 812, and an access transistor 810.

During operation, the MRAM cell 800 is selected for write/read operation by activating the word line 811 so that the access transistor 810 will conduct (e.g. turn-on), as will be understood by those skilled in the relevant arts. The MRAM cell 800 stores a logic "1" when the magnetic field of the adjusted magnet layer 804 is aligned with that of the permanent magnet layer 806, resulting in a relatively low resistance for current flow between the bit line terminal 801 and the source line terminal 812. The MRAM cell 800 stores a logic "0" when the magnetic field of the adjustable magnet layer 804 is mis-aligned (e.g. opposite) with that of the permanent magnet layer 806, resulting in a relatively high resistance for current flow between the bit line terminal 801 and the source line terminal 812. The logic state of the MRAM cell 800 can be "flipped" by applying a high voltage (and corresponding current) to the bit line terminal 801, causing the magnetic field of the adjustable magnet layer 804 to change polarity as will be understood by those skilled in the arts. Accordingly, the write control voltage 118 and read control voltage 120, discussed above, can be applied to the bit line terminal 801 for write and read operations. Further, during the read operation, the read current 122 can be measured from the source terminal 812 to determine the current logic state stored in MRAM cell 800.

Figure 9:
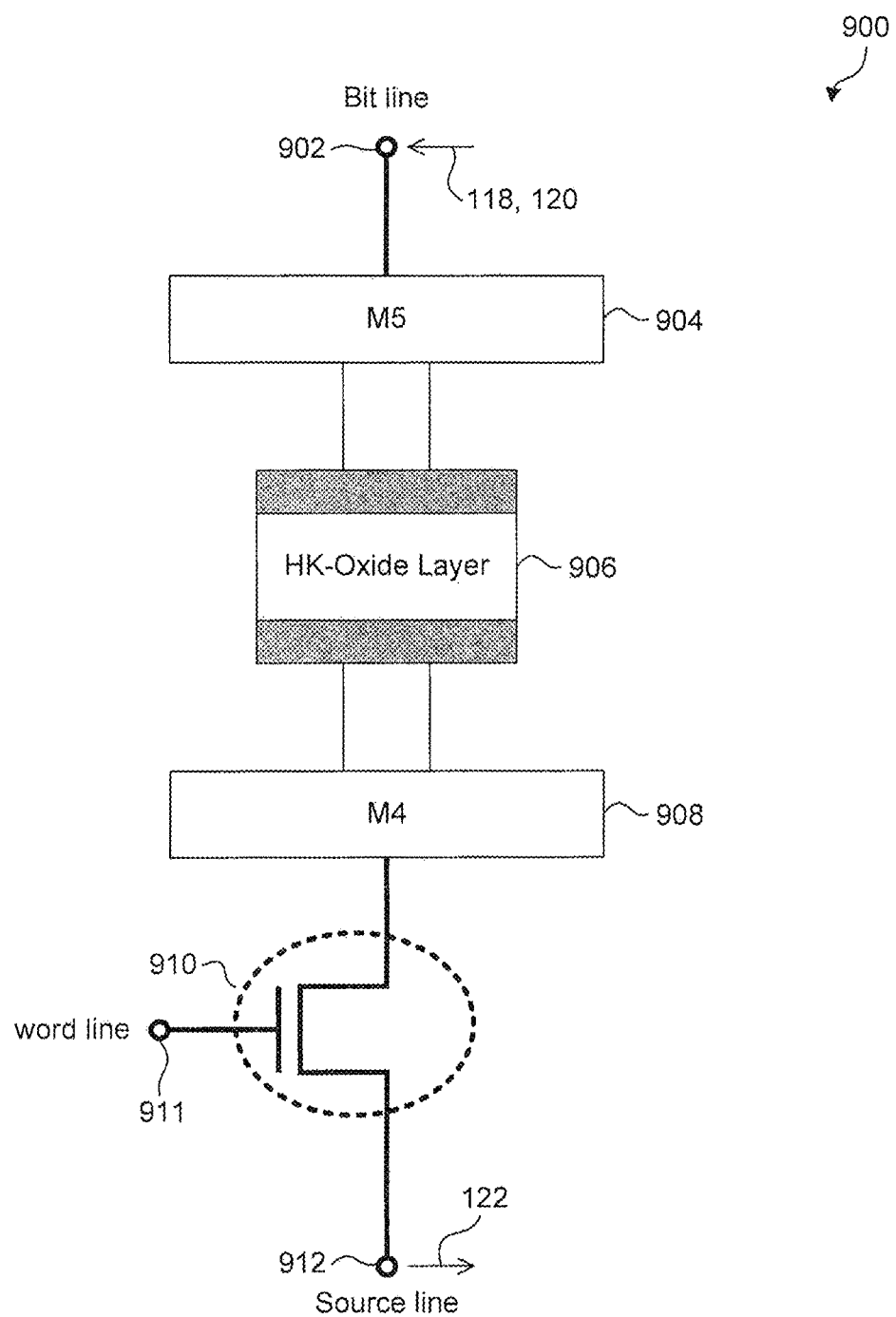
FIG. 9 illustrates an RRAM cell according to embodiments of the present disclosure.

FIG. 9 illustrates an RRAM cell 900 according to embodiments of the present disclosure. For example, RRAM cell 900 can be representative of one of the number of memory cells in the memory banks 106a-d discussed herein, and/or memory cell 412 of memory cell array 410. RRAM cell 900 is formed of a number of semiconductor layers in a stacked configuration, including metal layers 904 and 908, and a high-K oxide layer 906. The RRAM cell 900 further includes a bit line terminal 902, a source line terminal 912, and an access transistor 910.

During operation, the RRAM cell 900 is selected for write/read operation by activating the word line 911 so that the access transistor 910 will conduct (e.g. turn-on), as will be understood by those skilled in the relevant arts. The RRAM cell 900 stores a logic "1" when the high K oxide layer 906 is in a low resistance state, caused by a high voltage or current creating low resistance "tunnels" through the high-K oxide layer 906 as will be understood by those skilled in the arts. The RRAM cell 900 stores a logic "0" when the low resistance tunnels are broken or not present. Similar to the MRAM, the write control voltage 118 and read control voltage 120, discussed above, can be applied to the bit line terminal 902 for write and read operations for the RRAM cell 900. Further, during the read operation, the read current 122 can be measured from the source terminal 912 to determine the current logic state stored in RRAM cell 900.

CONCLUSION

The foregoing Detailed Description discloses a memory functional tester to perform a write/read functional test on a memory bank having a number of memory cells over a number of write control voltages. The memory functional tester includes an adjustable voltage generator circuit, a read current measurement circuit, and a controller. The adjustable voltage generator circuit is configured to generate each write control voltage of the number of write control voltages to store first and second logic states in the number of memory cells during respective first and second write cycles of the write/read functional test. The read current measurement circuit is configured to measure first and second sets of read currents that define first and second sets of read current distributions associated with the each write control voltage of the number of write control voltages. The first read current distribution represents the first logic state stored in the number of memory cells during the first write cycle, and the second read current distribution represents the second logic state stored in the number of memory cells during the second write cycle. The controller is configured to determine a number of error currents that fall outside the first and second read current distributions associated with the each write control voltage of the number of write control voltages, determine an error rate associated with the each write control voltage based on the corresponding number of error currents associated with the each write control voltage and a number of memory cells in the number of memory cells, compare the error rates associated with the number of write control voltages with each other, and select a preferred write control voltage from the number of write control voltages based on the comparison of the error rates.

The foregoing Detailed Description further discloses a method of testing a memory device having a number of memory banks. The method includes selecting a first memory bank of the number of memory banks, the first memory bank including a number of memory cells. A write/read functional test is performed on the first memory bank over a number of write control voltages to determine a number of error rates, each error rate associated with a corresponding write control voltage of the number of write control voltages. Afterwhich, a preferred write control voltage is selected from the number of write control voltages based on the number of error rates, wherein the preferred write control voltage is designated for use during subsequent write operations to the memory bank in an operational mode, and locking-in the preferred write control voltage for use in subsequent write operations to the first memory bank.

The foregoing Detailed Description further discloses a method of manufacturing a memory device having a number of memory banks. The method includes fabricating the memory device having the number of memory banks, and selecting a first memory bank of the number of memory banks, the first memory bank including a number of memory cells. A write/read functional test is performed on the first memory bank over a number of write control voltages to determine a number of error rates, each error rate associated with a corresponding write control voltage of the number of write control voltages. Afterwhich, a preferred write control voltage is selected from the number of write control voltages based on the number of error rates, wherein the preferred write control voltage is designated for use during subsequent write operations to the memory bank in an operational mode, and locking-in the preferred write control voltage for use in subsequent write operations to the first memory bank.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and number of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory functional tester to perform a write/read functional test on a memory bank having a plurality of memory cells, the memory functional tester, comprising:
   an adjustable voltage generator circuit configured to generate each write control voltage of a plurality of write control voltages to store first and second logic states in the plurality of memory cells during respective first and second write cycles of the write/read functional test;
   a read current measurement circuit configured to:
      measure first and second sets of read currents that define first and second sets of read current distributions associated with the each write control voltage of the plurality of write control voltages, wherein the first read current distribution represents the first logic state stored in the plurality of memory cells during the first write cycle, and the second read current distribution represents the second logic state stored in the plurality of memory cells during the second write cycle; and
   a controller configured to:

determine a number of error currents that fall outside the first and second read current distributions associated with the each write control voltage of the plurality of write control voltages;

determine an error rate associated with the each write control voltage based on the corresponding number of error currents associated with the each write control voltage and a number of memory cells in the plurality of memory cells, resulting in a plurality of error rates;

compare a lowest error rate of the plurality of error rates with a predetermined threshold; and determine whether the memory bank has passed the write/read functional test based on the comparison of the lowest error rate with the predetermined threshold.

2. The memory functional tester of claim 1, wherein the controller is further configured to:

determine the memory bank has passed the write/read functional test based on the lowest error rate being less than the predetermined threshold; and mark the memory bank as pass so the memory bank can be subsequently used for a field application.

3. The memory functional tester of claim 2, wherein the controller is further configured to:

determine the memory bank has failed the write/read functional test based on the lowest error rate being greater than the predetermined threshold; and mark the memory bank as fail so the memory bank cannot be subsequently used for a field application.

4. The memory functional tester of claim 1, wherein the controller is further configured to:

compare the error rates associated with the plurality of write control voltages with each other; and select a preferred write control voltage from the plurality of write control voltages based on the comparison of error rates, wherein the preferred write control voltage is associated with the lowest error rate of the error rates.

5. The memory functional tester of claim 4, wherein the controller is further configured to:

determine a first read detection window to fit the first current distribution associated with the preferred write control voltage; and determine a second read detection window to fit the second current distribution associated with the preferred write control voltage, wherein a subsequent read current generated during an operational mode will be compared against with the first read detection window and the second read detection window to determine whether the subsequent read current represents the first logic state or the second logic state.

6. The memory functional tester of claim 1, wherein for the each write control voltage, the adjustable voltage generator circuit is configured to:

generate the each write control voltage a first time to store the first logic state in the plurality of memory cells;

generate each read control voltage a first time to trigger read currents that define the first current distribution;

generate the each write control voltage a second time to store the second logic state in the plurality of memory cells; and generate each read control voltage a second time to trigger read currents that define the second current distribution.

7. The memory functional tester of claim 1, wherein the adjustable voltage generator circuit is configured to repeatedly increment the write control voltage by a predetermined amount to generate the plurality of write control voltages, and wherein each write control voltage is applied to the memory cells two successive times to store respective first and second logic states in the plurality of memory cells.

8. The memory functional tester of claim 1, wherein the memory bank is one of a Magnetic Random Access Memory (MRAM) memory bank or a Resistive Random Access Memory (RRAM) memory bank.

9. A method, comprising:

selecting a first memory bank of a plurality of memory banks, the first memory bank including a plurality of memory cells;

performing a write/read functional test on the first memory bank over a plurality of write control voltages to determine a plurality of error rates, each error rate associated with a corresponding write control voltage of the plurality of write control voltages;

comparing a lowest error rate of the plurality of error rates with a predetermined threshold; and determining whether the first memory bank has passed the write/read functional test based on the comparison of the lowest error rate with the predetermined threshold.

10. The method of claim 9, further comprising:

determining the first memory bank has passed the write/read functional test based on the lowest error rate being less than the predetermined threshold; and marking the first memory bank as pass so the first memory bank can be subsequently used for a field application.

11. The method of claim 10, further comprising:

determining the first memory bank has failed the write/read functional test based on the lowest error rate being greater than the predetermined threshold; and marking the first memory bank as fail so the first memory bank cannot be subsequently used for a field application.

12. The method of claim 9, further comprising:

selecting a preferred write control voltage from the plurality of write control voltages based on the plurality of error rates, wherein the preferred write control voltage is designated for use during subsequent write operations to the first memory bank in an operational mode.

13. The method of claim 12, further comprising:

locking-in the preferred write control voltage for use in subsequent write operations to the first memory bank.

14. The method of claim 12, wherein the selecting comprises:

comparing the error rates associated with the plurality of write control voltages with each other; and selecting the preferred write control voltage from the plurality of write control voltages based on the comparison of the error rates, wherein the preferred write control voltage is associated with the lowest error rate of the error rates.

15. The method of claim 9, wherein the performing the write/read functional test on the first memory bank includes:

applying each write control voltage to the plurality of memory cells to store first and second logic states in the plurality of memory cells during respective first and second write cycles; and measuring first and second sets of read currents associated with the each write control voltage of the plurality of write control voltages during respective first and second read cycles, wherein the first set of read currents includes a first read current distribution that represents the first logic state stored in the plurality of memory cells, and the second set of read currents includes a second read current distribution that represents the second logic state stored in the plurality of memory cells.

16. The method of claim 15, further comprising:

determining a number of error currents that fall outside the first and second read current distributions associated with each write control voltage of the plurality of write control voltages; and determining an error rate associated with the each write control voltage based on the corresponding number of error currents associated with the each write control voltage and a number of memory cells in the plurality of memory cells.

17. The method of claim 9, further comprising:

manufacturing the plurality of memory banks including the first memory bank.

18. A manufacturing method, comprising:

fabricating a memory device having a plurality of memory banks;

selecting a first memory bank of the plurality of memory banks, the first memory bank including a plurality of memory cells;

performing a write/read functional test on the first memory bank over a plurality of write control voltages to determine a plurality of error rates, each error rate associated with a corresponding write control voltage of the plurality of write control voltages;

comparing a lowest error rate of the plurality of error rates with a predetermined threshold; and determining whether the first memory bank has passed the write/read functional test based on the comparison of the lowest error rate with the predetermined threshold.

19. The manufacturing method of claim 18, further comprising:

determining the first memory bank has passed the write/read functional test based on the lowest error rate being less than the predetermined threshold; and marking the first memory bank as pass so the first memory bank can be subsequently used for a field application.

20. The manufacturing method of claim 19, further comprising:

determining the first memory bank has failed the write/read functional test based on the lowest error rate being greater than the predetermined threshold; and marking the first memory bank as fail so the first memory bank cannot be subsequently used for a field application.

21. The manufacturing method of claim 18, further comprising:

comparing the error rates associated with the plurality of write control voltages with each other;

selecting a preferred write control voltage from the plurality of write control voltages based on the comparison of the error rates, wherein the preferred write control voltage is associated with the lowest error rate of the error rates; and locking-in the preferred write control voltage for use in subsequent write operations to the first memory bank, wherein the preferred write control voltage is designated for use during subsequent write operations to the first memory bank in an operational mode.

* * * * *